(12) United States Patent
Yoon et al.

(10) Patent No.: US 7,662,253 B2
(45) Date of Patent: *Feb. 16, 2010

(54) APPARATUS FOR THE REMOVAL OF A METAL OXIDE FROM A SUBSTRATE AND METHODS THEREFOR

(75) Inventors: Hyungsuk Alexander Yoon, San Jose, CA (US); William Thie, Mountain View, CA (US); Yezdi Dordi, Palo Alto, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 382 days.

This patent is subject to a terminal disclaimer.

(21) Appl. No.: 11/237,457

(22) Filed: Sep. 27, 2005

(65) Prior Publication Data

US 2007/0072432 A1 Mar. 29, 2007

(51) Int. Cl.
 C23F 1/00 (2006.01)
 H01L 21/306 (2006.01)
 C23C 16/00 (2006.01)
(52) U.S. Cl. .............................. 156/345.43; 118/723 E
(58) Field of Classification Search ................. 118/722, 118/723 R, 723 E; 156/345.43
See application file for complete search history.

(56) References Cited

U.S. PATENT DOCUMENTS

| 5,693,241 | A | 12/1997 | Banks et al. |
| 5,961,772 | A | 10/1999 | Selwyn |
| 6,073,577 | A | 6/2000 | Lilleland et al. |
| 6,189,570 | B1 | 2/2001 | Redemann et al. |
| 6,534,921 | B1 | 3/2003 | Seo et al. |
| 6,936,546 | B2 * | 8/2005 | Robbins ................. 438/707 |
| 2003/0022432 | A1 | 1/2003 | Hobbs et al. |

FOREIGN PATENT DOCUMENTS

WO  WO 2005045873 A2 * 5/2005

OTHER PUBLICATIONS

Yoon et al., "Atmospheric Plasma for Ru Surface Treatment Application", Apr. 18, 2005 (Lam Research Corporation) 5 pp.
Ryder et al., "Bevel Edge Polymer Removal with Tube Atmosphere Plasma", Apr. 15, 2005, (Lam Research Corporation) 18 pp.

(Continued)

Primary Examiner—Parviz Hassanzadeh
Assistant Examiner—Maureen Gramaglia
(74) Attorney, Agent, or Firm—IP Strategy Group, P.C.

(57) ABSTRACT

An apparatus generating a plasma for removing metal oxide from a substrate is disclosed. The embodiment includes a powered electrode assembly, including a powered electrode, a first dielectric layer, and a first wire mesh disposed between the powered electrode and the first dielectric layer. The embodiment also includes a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the metal oxide.

20 Claims, 9 Drawing Sheets

OTHER PUBLICATIONS

Kunze, "Miniaturized Discharges Prospects and Limits for Quantitative Analysis", (Dissertation) Jun. 25, 2004, 143 pp.
Kuthi et al., "Modified Surface Removal with Atmospheric Plasma", Undated, (Lam Research Corporation) 10 pp.
Selwyn et al., "Materials Processing using an Atmospheric-Pressure Plasma Jet", (1999-2000) Physics Division Progress Report., pp. 189-197.
Babayan et al., "Deposition of Silicon Dioxide Films with a Non-Equilibrium Atmospheric-Pressure Plasma Jet", Sep. 12, 2001, Institute of Physics Publishing., pp. 573-578, stacks.iop.org/PSST/10/573.
Ichiki et al., "An Atmospheric-Pressure Microplasma Jet Source for the Optical Emission Specroscopic Analysis of Liquid Sample", Sep. 18, 2003, (Inst. of Phys. Pub., Plasma Srcs Sci Tech. 12), pp. 16-20, stacks.iop.org/PSST/12/S16.
Tepper et al., "Pulsed Uniform Barrier Discharges at Atmospheric Pressure", (Aug./Sep. 1998), Hakone VI Int'l Symp. On High Pressure, Low Temp Plasma Chem., Cork, Ireland, 5 pp.
Fong, "Electroless Cu Deposition Process on TIN for ULSI Interconnect Fabrication via PD/Sn Colloid Activation", Aug. 22, 2005, http://www.findarticles.com/p/articles/mi_qa3776/is_200301/ai_n9178017/print.
Davis, "How does a Faraday Cage Work? Or, Why can a Satellite Dish have Holes in it?", (2005) http://www.physlink.com/Education/AskExperts/ae176.cfm.
Aldea et al., "Generation of a Stable Atmospheric Glow in a DBD Configuration", Undated, Eindhoven Univ of Tech, Netherlands, 7 pp.
Kogelschatz, "Fundamentals and Applications of Dielectric-Barrier Discharges", (May 24, 2000), ABB Corp Research Ltd, Baden, Switzerland.
International (PCT) Search Report mailed Mar. 30, 2007 re PCT/US2006/036959.
Written Opinion mailed Mar. 30, 2007 re PCT/US2006/036959.
"International Preliminary Report on Patentability", Issue in PCT Application No. PCT/US2006/036959; Mailing Date.: Apr. 10, 2008.

* cited by examiner

APPARATUS FOR THE REMOVAL OF A METAL OXIDE FROM A SUBSTRATE AND METHODS THEREFOR

BACKGROUND OF THE INVENTION

The present invention relates in general to substrate manufacturing technologies and in particular to apparatus for the removal of a metal oxide from a substrate and methods therefor.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into the operational speed of these devices.

Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Copper (Cu) is commonly used as to interconnect microelectronic circuits on the substrate. However, before bulk Cu deposition, some type of copper sputtering deposition process is generally required to deposit a thin seed layer (about 500 Å to about 2000 Å). A Cu seed layer generally provides the nucleation sites for the bulk Cu grain and film formation. That is, first a barrier layer may be deposited using a PVD (plasma vapor deposition) process. The Cu seed may then be deposited also using a PVD process, and finally the remaining bulk Cu may be deposited using electrochemical plating (ECP).

In general, ECP involves placing the substrate (with a Cu seed) on a plastic substrate holder. A cathode then holds the substrate with a conducting steel ring and immerses it in a plating solution containing sulfuric acid ($H_2SO_4$), copper sulfate ($Cu(SO_4)$) and other additives. An electrical current flows form the anode, which is a copper plate to the cathode. In the solution, the $Cu(SO_4)$ disassociates to a copper ion, $Cu^{2+}$, and a sulfate ion $SO_2^{2-}$. When the copper ions are attracted to the substrate surface, where they become absorbed on the copper seed layer.

However, new approaches to Cu interconnect integration are emerging to overcome short falls of current integrations schemes. For example, one emerging technology is the use of electroless Cu plating that can replace the Copper seed and/or Cu fill. In general, an underlying barrier layer (e.g., Ti, Tin, Ta, TaN, W, WN, Ru, etc.) is catalyzed by a Pd/Sn colloid, which serves as an activator for electroless copper deposition. After activation, electroless deposition of Cu occurs on the catalytic surface. In general, the coverage of the Cu deposit reaches 100% and the adsorptive amount of Pd is greatly increased by the conditioning process. However, in order to insure uniformity, the barrier layer must substantially be free of any metal oxide they may have formed prior to the electroless Cu plating process.

A commonly known, relatively simple, and low-cost method of metal oxide removal may be the use of an atmospheric (or high pressure) plasma jet (APPJ), which generally allows a plasma to be focused on a particular location on the substrate, thus minimizing potential damage to dies on the substrate. An APPJ device generally mixes a large amount of an inert gas (e.g., He, etc.) with a small amount of a reactive gas (e.g., $H_2$, $O_2$, etc.) in an annular volume (e.g., tube, cylinder, etc.) formed between an rf-powered electrode (along the longitudinal axis of the source) and a grounded electrode. The generated plasma may then be forced out one end of the annular volume (plasma effluent) by pressure caused by the influx of gases (gas influent). The shape and size of the plasma effluent may be controlled by adjusting the gas influent pressure, as well as the shape and size of the discharge orifice on the APPJ device.

In addition, an APPJ may also be combined with a reactive ion etch (RIE) in order to remove the metal oxide. In general, RIE combines both chemical and ion processes in order to remove material from the substrate. Generally ions in the plasma enhance a chemical process by striking the surface of the substrate, and breaking the chemical bonds of the atoms on the surface in order to make them more susceptible to reacting with the molecules of the chemical process. Operating at ambient pressure conditions, atmospheric plasmas tend to relatively inexpensive in comparison to low-pressure plasmas that require sophisticated pumping systems to operate at near vacuum conditions. However, APPJ devices also tend to be susceptible to arcing.

An arc is generally a high power density short circuit which has the effect of a miniature explosion. When arcs occur on or near the surfaces of the target material or chamber fixtures, substantial damage can occur, such as local melting. Plasma arcs are generally caused by low plasma impedance which results in a steadily increasing current flow. If the resistance is low enough, the current will increase indefinitely (limited only by the power supply and impedance), creating a short circuit in which all energy transfer takes place. This may result in damage to the substrate as well as the plasma chamber. In order to inhibit arcing, relatively high plasma impedance generally must be maintained. A common solution may be to limit the rate of ionization in the plasma by using a large volume of inert gas at a relatively high flow rate. Another solution may be to position slots along the longitudinal axis of the powered electrode with the same electrical potential, in order to reduce the likelihood of arcing.

For example, in a common atmospheric plasma configuration, rf power creates an electrical discharge between a power electrode and a set of grounded electrodes that causes a process gas such as $O_2$ to ionize. However, as the density of electrically charged species (i.e., ions, etc.) in the plasma increases (typically above 2%), the likelihood of destructive arcing at the exposed electrode also increases. Hence, most atmospheric plasma processes typically also comprise mostly non-electrically charged (inert) gas, such as He, which limit ionization. In a metal oxide byproduct removal application, however, the large volume (high flow) of inert gas may make the use of atmospheric plasma economically impractical.

For example, the substantial removal of a metal oxide from just a 5 mm² surface area on the substrate may require over 10 slm (standard liters per minute) of an inert gas. This may correspond to the consumption of over 100 liters of the inert gas for a single typical 300 mm substrate. Aside from the cost of obtaining a large volume of a semi-conductor grade inert gas, the storage of such a volume in a substrate fabrication facility may be unworkable. Additionally, because of equipment cost, cleaning and recycling the inert gas may be economically impractical.

Referring now to FIG. 1, a simplified diagram of an atmospheric plasma jet device, in which both the powered electrode and the ground electrode are each configured on a cavity wall, is shown. Generally, an inert gas 118 (e.g., He, etc.) and a process gas 116 (e.g., $H_2$, $CF_4$, etc.) are flowed into sealed box 114 for pressurizing. The gases are, in turn, feed into a discharge chamber cavity 110 through gas influent 115, at which point a plasma is struck with an rf power source 108 and creates plasma effluent 104 from discharge orifice 117 at one end of cavity 110 to clean substrate 102. In general, the shape and diameter of discharge orifice 117 may affect the corresponding shape of plasma effluent 104 along both the lateral and longitudinal axis (e.g., laterally narrow and longitudinally deep, laterally wide and longitudinally shallow, etc.). However, as previously stated, a large volume of inert gas may be required to prevent the generation of arc 105 between powered electrode 106 to grounded electrode 112.

Referring now to FIG. 2, a simplified diagram of an atmospheric plasma jet device, in which a powered electrode is configured as a center rod and a grounded electrode(s) is configured on a cavity inner surface, is shown. As before, generally, an inert gas 118 (e.g., He, etc.) and a process gas 116 (e.g., $CF_4$, $H_2$, etc.) are flowed into sealed box 114 for pressurizing. The gases are, in turn, feed into a discharge chamber cavity 110 through gas influent 115, at which point a plasma may be struck with an rf power source 108 and creates plasma effluent 104 from discharge orifice 117 at one end of cavity 110 to clean substrate 102. In general, the shape and diameter of discharge orifice 117 may affect the corresponding shape of plasma effluent 104 along both the lateral and longitudinal axis (e.g., laterally narrow and longitudinally deep, laterally wide and longitudinally shallow, etc.). However, as previously stated, a large volume of inert gas may be required to prevent the generation of arc 105 between powered electrode 106 to grounded electrode 112.

In view of the foregoing, there are desired apparatus for the removal of a metal oxide from a substrate and methods therefor.

SUMMARY OF THE INVENTION

The invention relates, in an embodiment, to an apparatus generating a plasma for removing metal oxide from a substrate. The embodiment includes a powered electrode assembly, including a powered electrode, a first dielectric layer, and a first wire mesh disposed between the powered electrode and the first dielectric layer. The embodiment also includes a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the metal oxide.

The invention relates, in an embodiment, to a method for generating a plasma for removing metal oxide from a substrate. The method includes providing a powered electrode assembly, the powered electrode assembly including a powered electrode, a first dielectric layer, and a first wire mesh disposed between the powered electrode and the first dielectric layer. The method also includes providing a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the metal oxide. The method further includes introducing at least one inert gas and at least one process gas into the cavity, and applying an rf field to the cavity using the powered electrode to generate the plasma from the at least one inert gas and the at least one process gas.

The invention relates, in an embodiment, to a method for generating a plasma for removing metal oxide from a substrate. The method includes providing a powered electrode assembly, the powered electrode assembly including a powered electrode, a first dielectric layer, and a first wire mesh disposed between the powered electrode and the first dielectric layer. The method further includes providing a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the metal oxide. The method also includes applying an rf field to the cavity using the powered electrode to generate the plasma from at least one inert gas and the at least one process gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
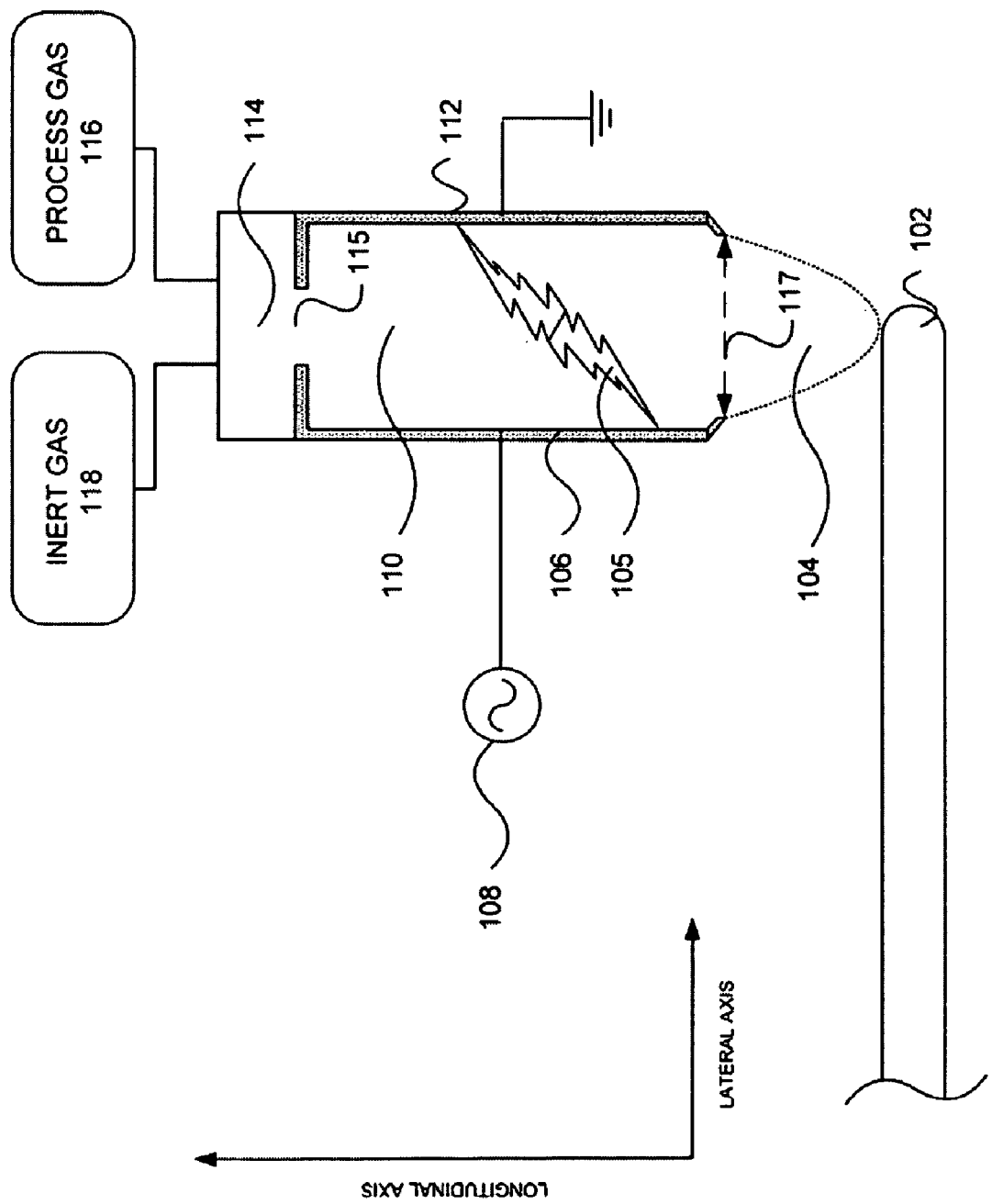
FIG. 1 shows a simplified diagram of an atmospheric plasma jet device, in which both the powered electrode and the ground electrode are each configured on a cavity wall.
Figure 2:
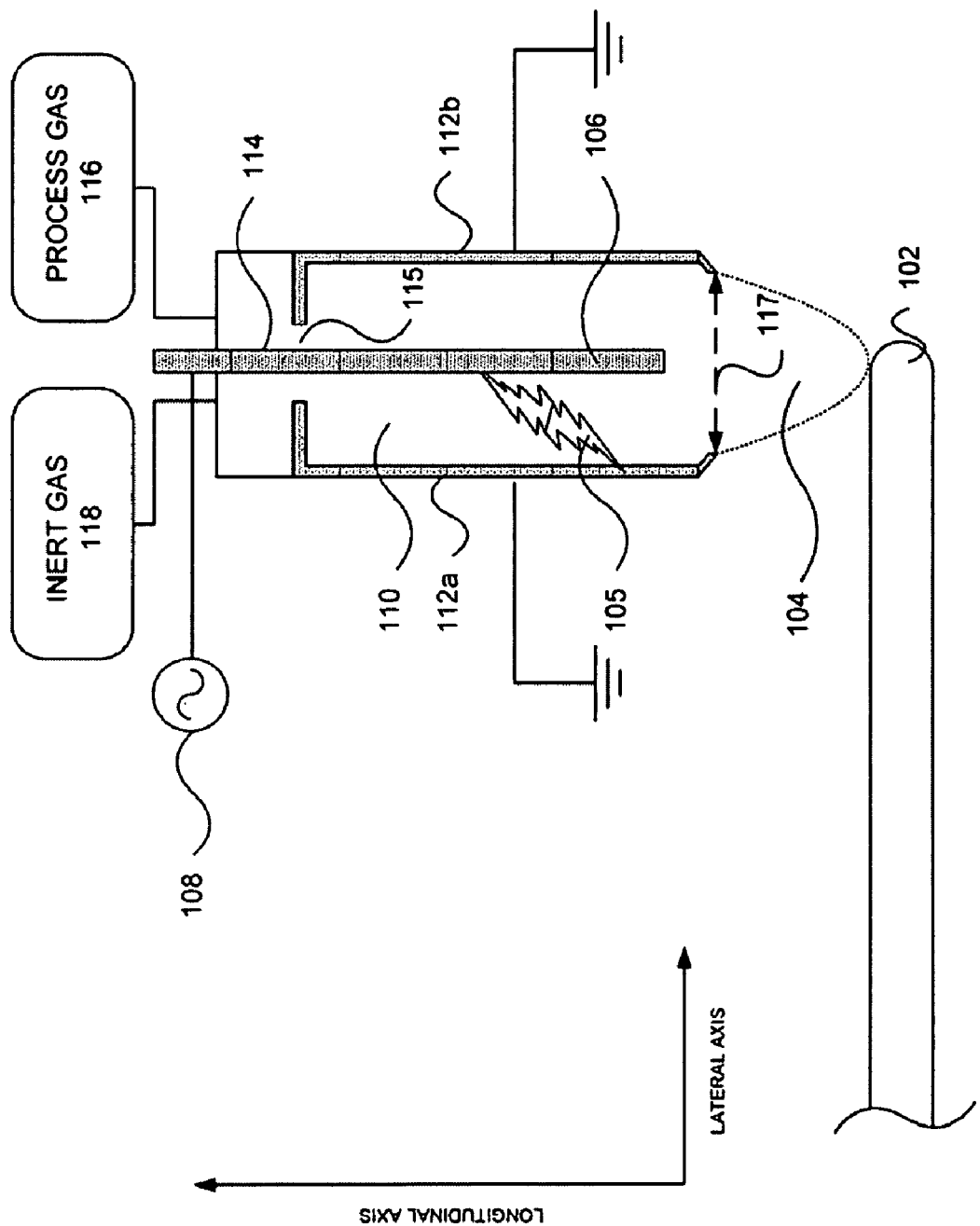
FIG. 2 shows a simplified diagram of an atmospheric plasma jet device, in which a powered electrode is configured as a center rod and a ground electrode(s) is configured on a cavity wall.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, the inventor believes that an atmospheric pressure plasma jet device, in which a dielectric barrier and a wire mesh are positioned between at least one electrode and a plasma (DWM-APPJ), may minimize arcing at a relatively low (less than about 1 slm) inert gas flow rate and hence may effectively remove metal oxide from a substrate.

In general, arcing occurs when an over voltage is applied to the discharge gap between electrodes, such that electron avalanches reach a critical stage where extremely fast streamer propagation becomes possible. As a result, micro discharge channels are formed. However, since a dielectric barrier (e.g., silicon dioxide, silicon nitride, etc.) positioned between an electrode and the atmospheric plasma tends to act as an electret (generally a material that accumulates electrical charges on its surface), and allows the micro discharge channels to spread across the dielectric barrier into surface discharges covering a much larger region than the original channel diameter. Due to charge build-up on the dielectric surface, the field at the location of a micro discharge collapses within a few nanoseconds after breakdown, thus terminating the current flow at this location. However, often this breakdown may also result in collapse of the plasma itself. In an advantageous way, the wire mesh prevents this collapse.

In general, electromagnetic waves, such as produced by an rf generator, do not penetrate through holes in a conducting surface like a wire mesh that are less than about a wavelength across. The generated rf field may be attenuated in different amounts and to different degrees by altering diameter of the wire mesh holes. It is believed that the creation of a secondary electric field on the surface of the dielectric barrier by the wire mesh with properly sized holes helps to sustain a plasma without arcing at a substantially smaller inert gas flow rate. Thus, the addition of at least one wire mesh between an electrode and a dielectric barrier in a DWM-APPJ allows a plasma jet to be generated that may substantially remove metal oxide byproducts at a particular substrate location, at relatively small inert gas flow rates (less than about 1 slm). In addition, unlike previous APPJ configurations, DWM-APPJ does not require slots along the longitudinal axis of the powered electrode. Slots generally increase the size, complexity, and cost of an APPJ.

Generally, the tolerance of one wavelength of the rf is taken to be the approximate cross over point between satisfactory and unsatisfactory performance. However, in general, holes or surface variations in the wire mesh must usually be less than a fraction of a wavelength across in order not to impose unacceptable performance degradation. In addition, the wire mesh must not be grounded in order to allow penetration of the rf field into the plasma.

In an embodiment, a dielectric barrier is positioned between a single electrode and a plasma. In an embodiment, a dielectric barrier is positioned between all the electrodes and a plasma. In an embodiment, a dielectric barrier is positioned between a powered electrode and a plasma. In an embodiment, a dielectric barrier is positioned between a grounded electrode and a plasma. In an embodiment, a wire mesh is placed between the dielectric barrier and an electrode. In an embodiment, a wire mesh is placed between each dielectric barrier and electrode. In an embodiment, a wire mesh is placed between a dielectric barrier and a powered electrode. In an embodiment, a wire mesh is placed between a dielectric barrier and a grounded electrode. In embodiment, the process gas is $H_2$.

In an embodiment, the wire mesh comprises Copper (Cu). In an embodiment, the wire mesh comprises stainless steel. In an embodiment, the wire mesh comprises brass. In an embodiment, the wire mesh is galvanized. In an embodiment, the wire mesh is monofilament. In an embodiment, the wire mesh has a rectangular weave. In an embodiment, the wire mesh has a hexagon weave. In an embodiment, the dielectric comprises biaxially-oriented polyethylene terphthalate (bo-PET) polyester, such as MYLAR® available from DuPont Teijin Films (www.dupontteijinfilms.com). In an embodiment, the dielectric comprises a ceramic. In an embodiment, the dielectric comprises formed of a material comprising polytetrafluoroethylene (PTFE), such as TEFLON® available from DuPont (www.dupont.com).

Figure 3:
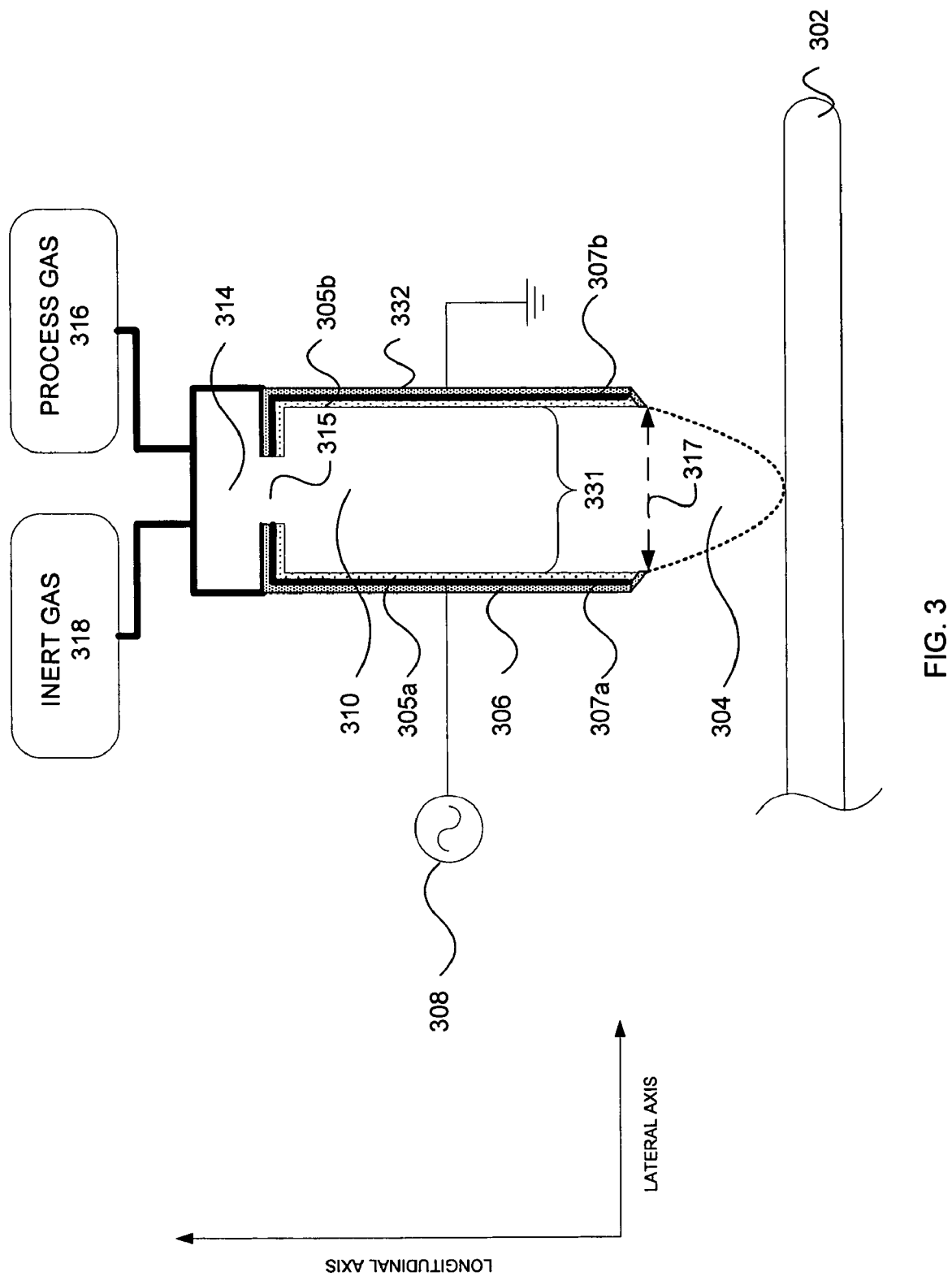
FIG. 3 shows a simplified diagram of a DWM-APPJ device, which both the powered electrode and the ground electrode are each configured on a cavity wall, according to an embodiment of the invention.

Referring now to FIG. 3, a simplified diagram of a DWM-APPJ device is shown, which both the powered electrode and the ground electrode are each configured on a cavity wall, according to an embodiment of the invention. In addition, unlike commonly used configurations, wire mesh 307a positioned between powered electrode 306 and dielectric barrier 305a, and wire mesh 307b positioned between grounded electrode 332 and dielectric barrier 305b, may allow a plasma to be sustained without arcing at a substantially smaller inert gas flow rate (less than about 1 slm) than is commonly required (e.g., about 10 slm, etc.). Generally, an inert gas 318 and a process gas 316 are flowed into sealed box 314 for pressurizing. The gases are, in turn, feed into a discharge chamber cavity 310 through gas influent 315, at which point plasma is struck with an rf power source 308 and creates plasma effluent 304 from discharge orifice 317 at one end of cavity 310, in order to clean substrate 302. In addition, although each electrode is configured with a wire mesh in this embodiment, other embodiments may comprise only a single wire mesh on either powered electrode 306 or grounded electrode 332. In embodiment, diameter 331 is about between 0.5 mm and about 6 mm. Advantages of this embodiment include the ability to generate a plasma jet that substantially removes metal oxide byproducts with a relatively small inert gas flow rate (less than about 1 slm), avoiding the cost of obtaining a large volume of a semi-conductor grade inert gas, or in purchasing expensive inert gas recycling equipment.

Figure 4:
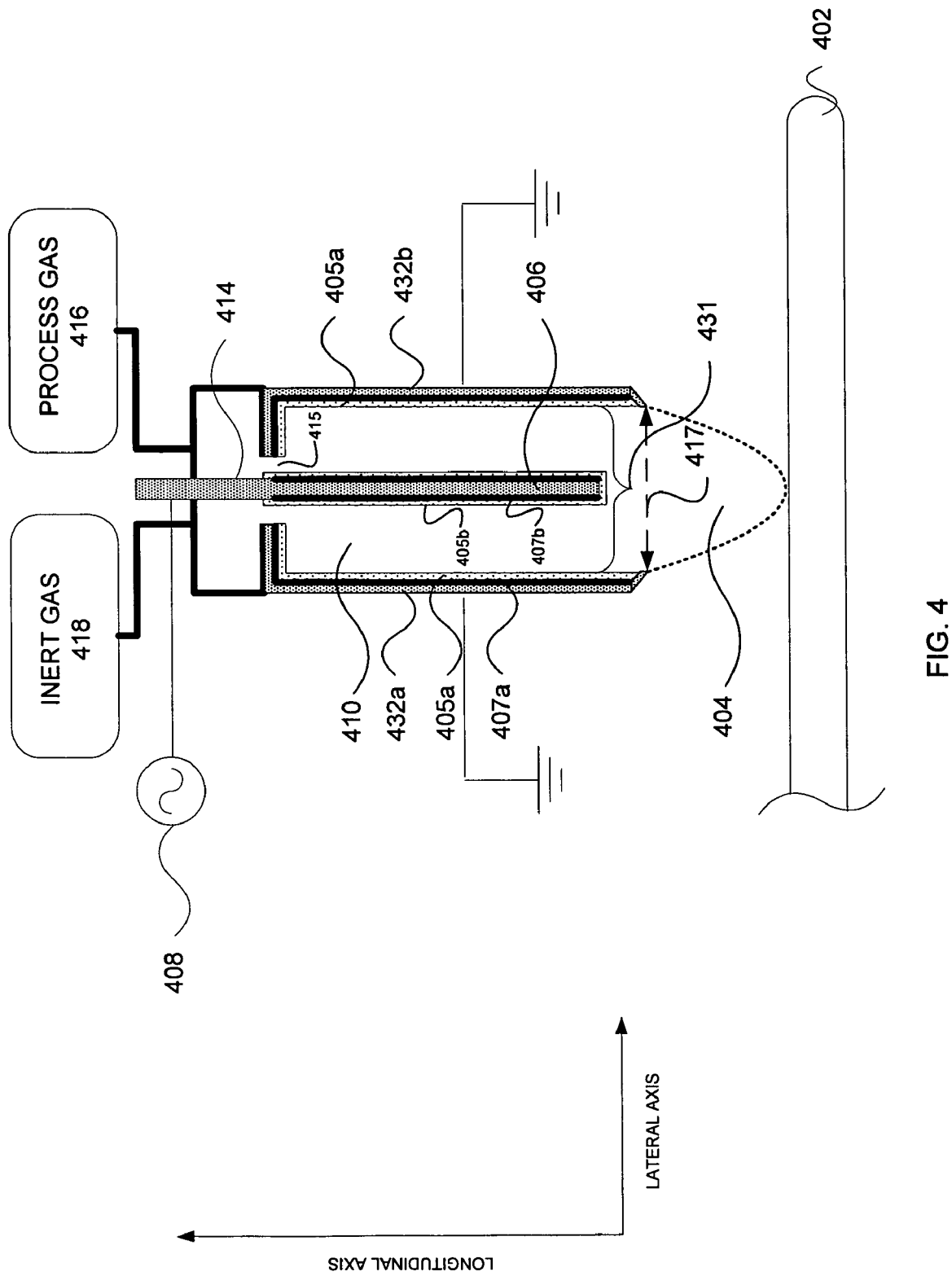
FIG. 4 shows a simplified diagram of a DWM-APPJ device in which a powered electrode is configured as a center rod and a ground electrode(s) is configured on a cavity inner surface, according to an embodiment of the invention.

Referring now to FIG. 4, a simplified diagram of a DWM-APPJ device is shown, in which a powered electrode is configured as a center rod and a ground electrode(s) is configured on a cavity inner surface, according to an embodiment of the invention. In addition, unlike the prior art, a wire mesh 407b positioned between powered electrode 406 and dielectric barrier 405b, and wire mesh 407a is positioned between grounded electrode 432a-b and dielectric barrier 405a, may allow a plasma to be sustained without arcing at a substantially smaller inert gas flow rate (less than about 1 slm) than is commonly required (e.g., about 10 slm, etc.). As before, generally, an inert gas 418 and a process gas 416 are flowed into sealed box 414 for pressurizing. The gases are, in turn, feed into a discharge chamber cavity 410 through gas influent 415, at which point a plasma is struck with an rf power source 408 and creates plasma effluent 404 from discharge orifice 417 at one end of cavity 410 to etch or clean substrate 402. In embodiment, diameter 431 is about between 0.5 mm and about 6 mm. Advantages of this embodiment include the ability to generate a plasma jet that substantially removes metal oxide byproducts with a relatively small inert gas flow rate (less than about 1 slm), avoiding the cost of obtaining a large volume of a semi-conductor grade inert gas, or in purchasing expensive inert gas recycling equipment.

For example, using a DWM-APPJ device in order to remove bevel edge polymer, at a power setting of 1-20 W rf power, and a frequency of about 2 MHz to about 13.56 MHz, less than 1 slm of He flow may be required to prevent arcing with about 3.9% $H_2$ in He. This is substantially less than about 10 slm of He normally required for a comparable operation with a commonly used APPJ device.

Figure 5:
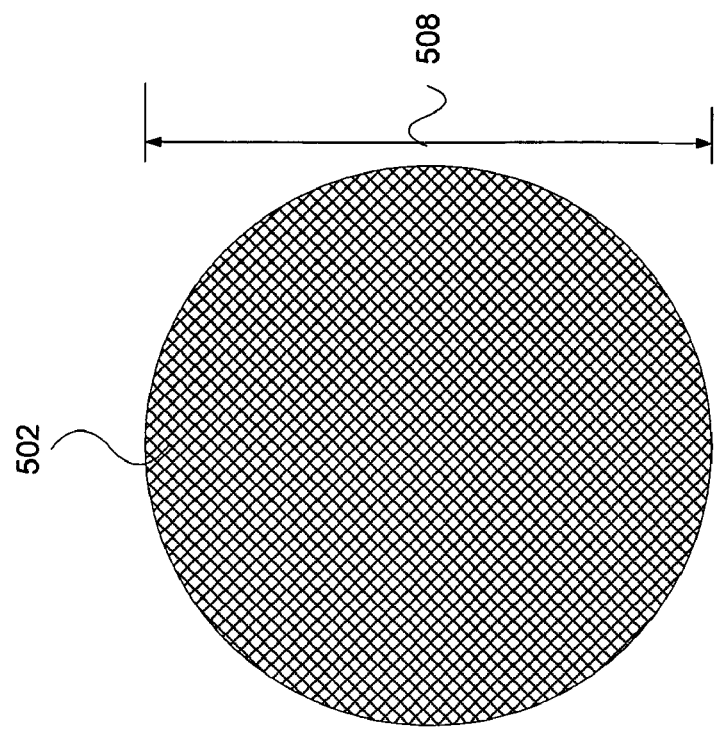
FIG. 5 shows a simplified diagram of a DWM-APPJ device configured to create an atmospheric plasma curtain, according to an embodiment of the invention.
Figure 5:
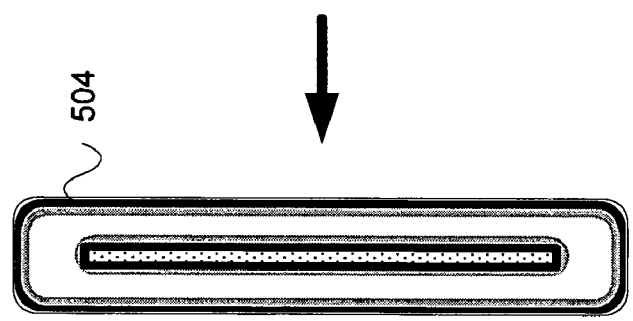
Figure 5:
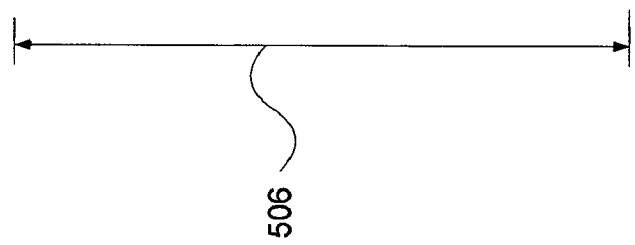
Figure 5:
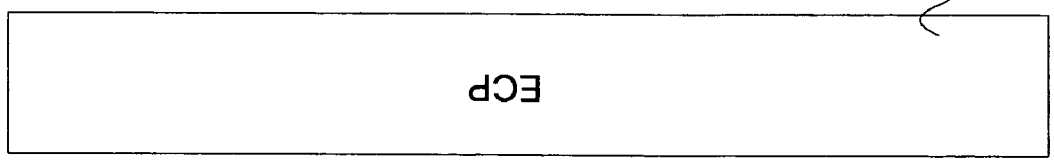

Referring now to FIG. 5, a simplified diagram of a DWM-APPJ device configured to create an atmospheric plasma curtain is shown, according to an embodiment of the invention. In general, APPJ devices tend to have a relatively small diameter when compared to a diameter of the substrate. In order to process a substantial portion of a substrate, either the APPJ device itself, or the substrate, is generally rotated to insure that the plasma effluent contact the substrate surface, a potentially time consuming process. However, in an innovative fashion, DWM-APPJ 504 may be configured such that the discharge orifice width 506 is at least as wide as the diameter 508 of substrate 502. The resulting plasma effluent produces a plasma curtain that may simultaneously contact an entire slice (parallel to orifice width 506) of substrate 502, allowing a metal oxide to be removed as the substrate is inserted into the electrodeless Cu plating apparatus (ECP) 510, with almost no additional processing time required, substantially improving manufacturing yield.

Figure 6A:
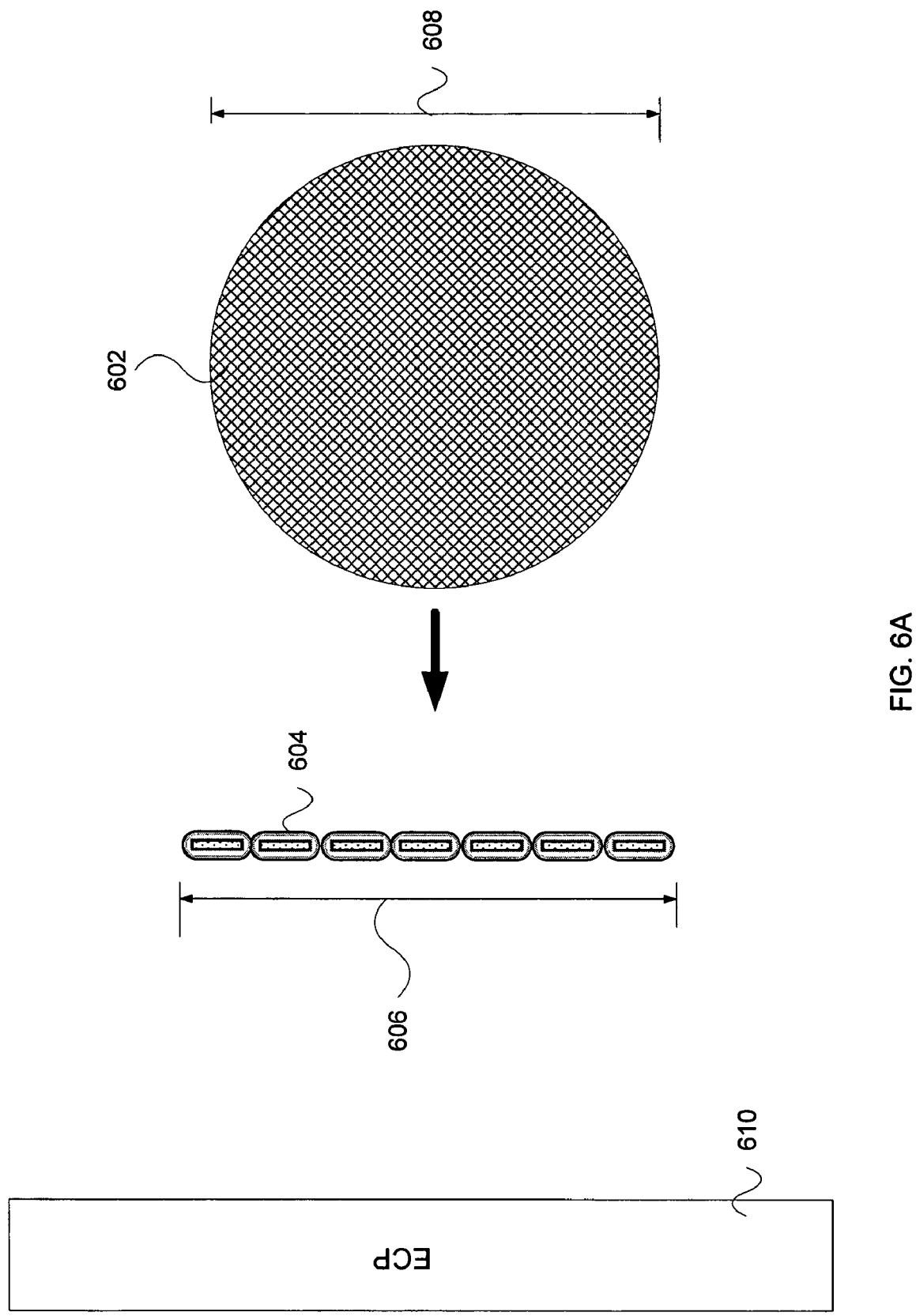
FIG. 6A shows a simplified diagram of a set of DWM-APPJ devices configured to create a plasma curtain, according to an embodiment of the invention.

Referring now to FIG. 6A, a simplified diagram of a set of DWM-APPJ devices is configured to create a plasma curtain, according to an embodiment of the invention. As previously stated, since APPJ devices tend to have a relatively small diameter when compared to the diameter of the substrate, either the APPJ device itself or the substrate is generally rotated to insure that the plasma effluent contact the entire substrate surface. However, in an innovative fashion, a set of DWM-APPJ devices 604 may configured such that the aggregate discharge orifice widths are at least as wide as the diameter of substrate 602. This may be beneficial in several respects. A set of smaller gas flow rates to correspondingly smaller DWM-APPJ devices 604 may be easier to control and tune. In addition, different DWM-APPJ devices may be configured with different flow rates and/or proportions in relationship to location (e.g., center of the substrate as opposed to edge of substrate), in relationship to time (initial atmospheric plasma contact on the substrate as opposed to the middle or end of the process), in relationship to the type of substrate, etc. As in FIG. 5, the resulting plasma effluent produces a plasma curtain that may simultaneously contact an entire slice (parallel to orifice width 606) of substrate 602, allowing metal oxide to be removed as the substrate is inserted into the electrodeless Cu plating apparatus (ECP) 610, with almost no additional processing time required, and substantially improving manufacturing yield.

Figure 6B:
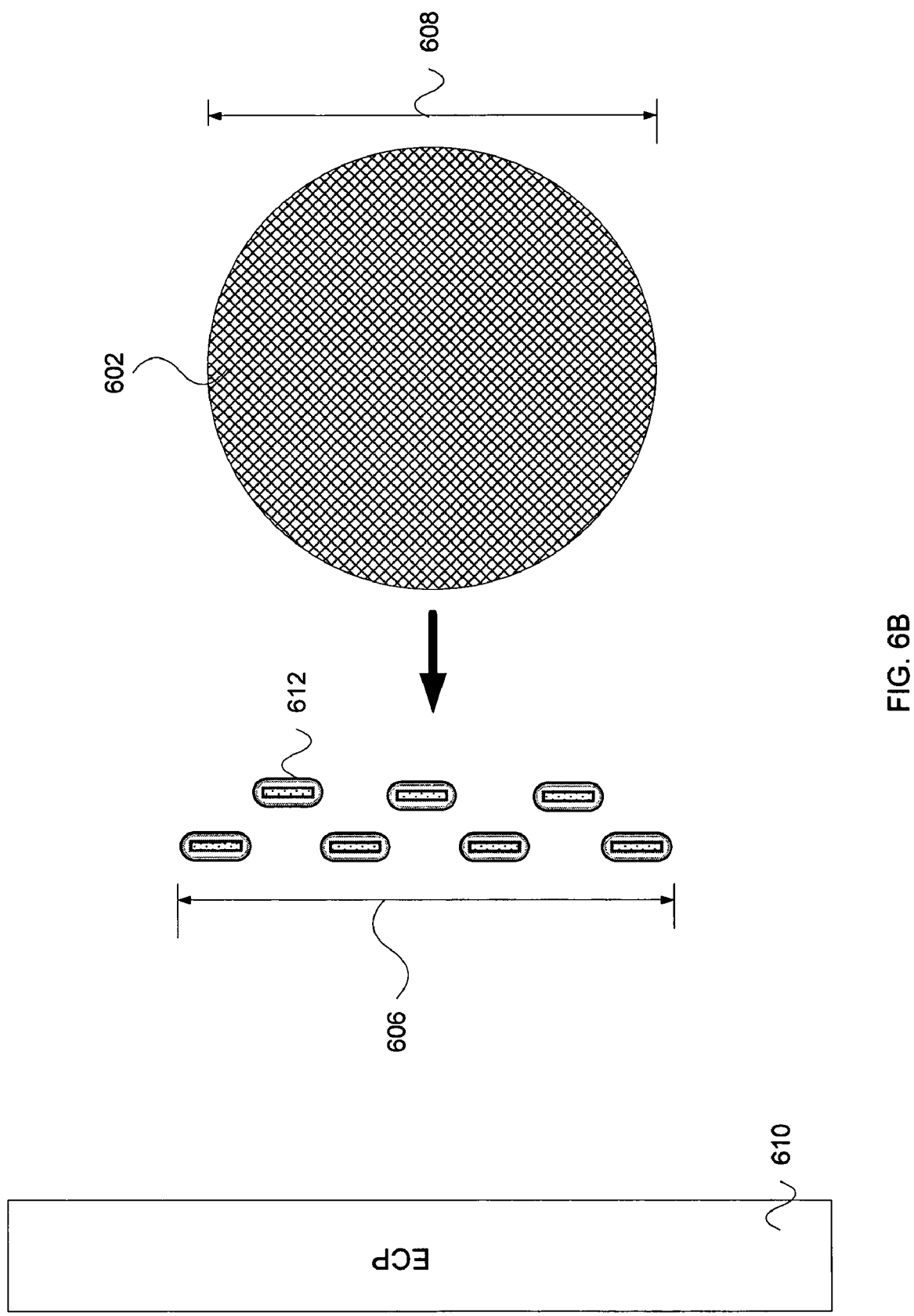
FIG. 6B shows a simplified diagram of a set of offset DWM-APPJ devices configured to create a plasma curtain, according to an embodiment of the invention.

Referring now to FIG. 6B, a simplified diagram of a set of offset DWM-APPJ devices is configured to create a plasma curtain, according to an embodiment of the invention. As previously stated, since APPJ devices tend to have a relatively small diameter when compared to the diameter of the substrate, either the APPJ device itself or the substrate must be rotated to insure that the plasma effluent contact the entire substrate surface. However, in an innovative fashion, a set of offset DWM-APPJ devices 612 may configured such that the aggregate discharge orifice widths are at least as wide as the diameter of substrate 602. This may be beneficial in several respects. As previously state, a set of smaller gas flow rates to correspondingly smaller DWM-APPJ devices 604 may be easier to control and tune. In addition, different DWM-APPJ devices may be configured with different flow rates and/or proportions in relationship to location (e.g., center of the substrate as opposed to edge of substrate), in relationship to time (initial atmospheric plasma contact on the substrate as opposed to the middle or end of the process), in relationship to the type of substrate, etc. Furthermore, individual plasma effluents may be isolated from each other, reducing potential cross-flow interference, and potentially improving metal oxide removal efficiency. As in FIG. 5, the resulting plasma effluent produces a plasma curtain that may simultaneously contact an entire slice of substrate 602, allowing metal oxide to be removed as the substrate is inserted into the electrodeless Cu plating apparatus, with almost no additional processing time required, and substantially improving manufacturing yield.

Figure 7:
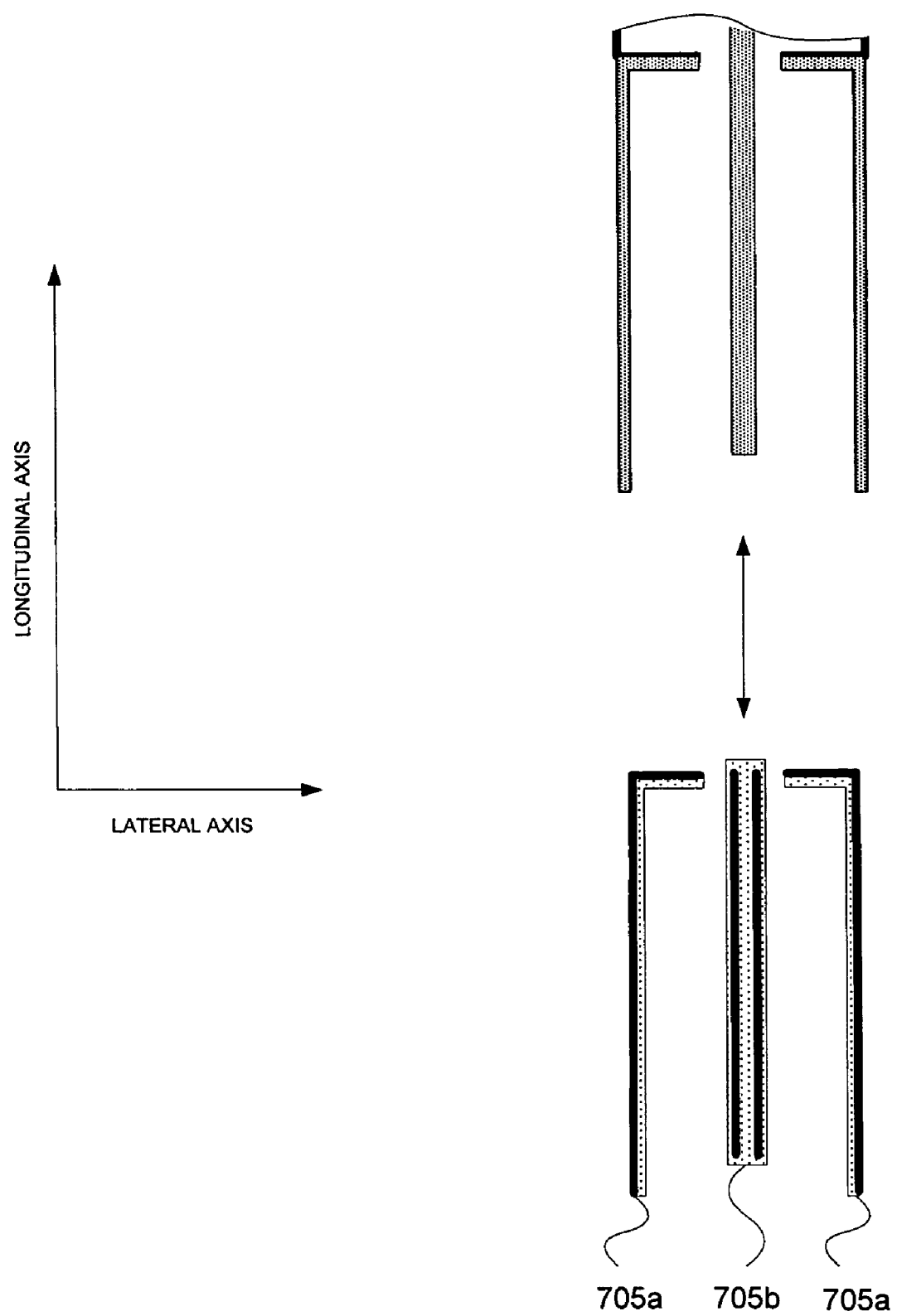
FIG. 7 shows a simplified diagram of a DWM-APPJ device, in which a set of wire mesh-dielectric sleeves is changeable, according to an embodiment of the invention.

Referring now to FIG. 7, a simplified diagram of a DWM-APPJ device, in which a set of wire mesh-dielectric sleeves is changeable, is shown, according to an embodiment of the invention. As previously described, an rf field may be attenuated in different amounts and to different degrees by altering diameter of the wire mesh holes. Hence, allowing various wire mesh-dielectric sleeves 705a and 705b, each with different wire mesh hole diameter, may allow the DWM-APPJ device to be optimized for a particular configuration or recipe. That is, each wire mesh-dielectric sleeve 705a and 705b is positioned in the DWM-APPJ between the appropriate electrode and a plasma in order to minimize arcing. In an embodiment, 705a and 705b have the same hole diameter, for any given configuration. In an embodiment, 705a and 705b have different hole diameters for any given configuration.

In an embodiment, a wire mesh layer is sandwiched between two dielectric layers. In an embodiment, a wire mesh layer is bonded to a dielectric layer with an adhesive, as a silicon adhesive. In an embodiment, a wire mesh layer is secured to a dielectric layer using a pressure force (along a lateral axis). In an embodiment, a wire mesh layer is secured to a dielectric layer using a friction force (along a longitudinal axis). In an embodiment, a wire mesh-dielectric sleeve is secured to an electrode using a pressure force (along a lateral axis). In an embodiment, a wire mesh dielectric sleeve is secured to a dielectric layer using a friction force (along a longitudinal axis).

For example, decreasing the flow rate of an inert gas would generally increase the likelihood of arcing for a given configuration (e.g., process gas flow rate, process gas type, rf power, etc.). However, inserting a set of wire mesh sleeves each with a smaller hole diameter may sustain the plasma at the lower inert gas flow rate without arcing. In addition, different wire mesh materials (e.g., composite metals, platinum, etc.) may also be used, without the necessity of having to redesign the DWM-APPJ device itself.

Figure 8:
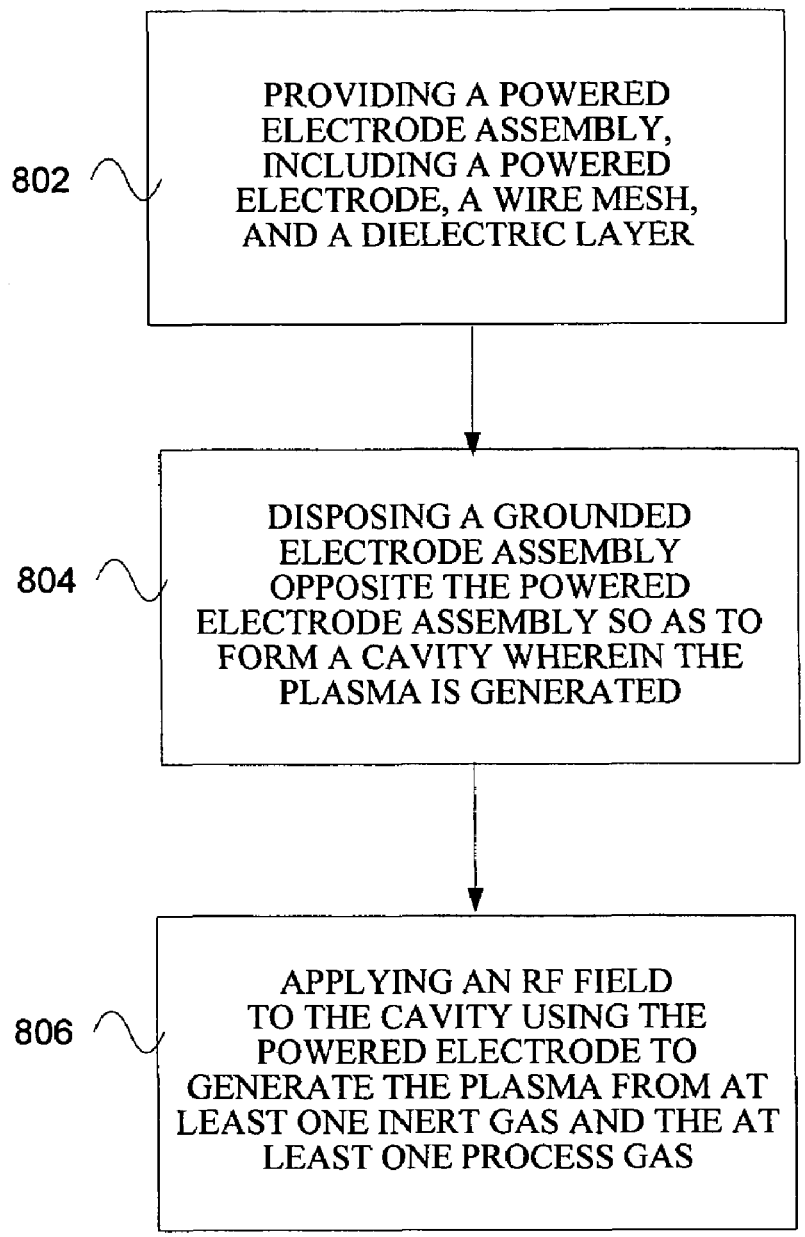
FIG. 8 shows a simplified method of optimally removing metal oxide from a substrate with a DWM-APPJ device, according to an embodiment of the invention.

Referring now to FIG. 8, a simplified method of optimally removing metal oxide from a substrate with a DWM-APPJ device is shown, according to an embodiment of the invention. Initially, at 802, a powered electrode assembly, including a powered electrode, a wire mesh, and a dielectric layer is provided. In an embodiment, the wire mesh may include one of copper, stainless steel, brass, and galvanized metal. In an embodiment, the dielectric layer may include one of silicon dioxide, silicon nitride, boPET (such as MYLAR®), ceramic, or PTFE (such as TEFLON®). Next, at 804, a grounded electrode assembly is disposed opposite the powered electrode assembly so as to form a cavity wherein the plasma is generated. In an embodiment, the cavity may be an annular volume. In an embodiment, the powered electrode is a longitudinal probe configured in the cavity. Next, at 806, an rf field is applied to the cavity using the powered electrode to generate the plasma from at least one inert gas and the at least one process gas.

This invention is substantially distinguished from the prior art in several respects. For example, this combines at least one dielectric barrier and at least one wire mesh with an APPJ (DWM-APPJ) in order to generate a plasma jet that substantially removes metal oxide byproducts at a particular substrate location with a relatively small inert gas flow rate (less than about 1 slm). In addition, unlike common and more complex APPJ device configurations, this invention does not reduce arcing through the use of slots, high flow velocities, and/or an alumina cap. Furthermore, this invention does not require any specialized and/or equipment to maintain a vacuum, does not physically contact to the substrate minimizing the likelihood of a damaging scratch, and is relatively easy to integrate into existing processes because of the minimal equipment requirements.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCD, etc.). Furthermore, the term set as used herein includes one or more of the named element of the set. For example, a set of "X" refers to one or more "X."

Advantages of the invention include the removal of a metal oxide from a substrate at a relatively low (less than about 1 slm) inert gas flow rate with minimal arcing. Additional advantages include the ability to easily integrate a DWM-APPJ cleaning device into an in-situ wet cleaning process, and the optimization of a substrate manufacturing process.

Having disclosed exemplary embodiments and the best mode, modifications and variations may be made to the disclosed embodiments while remaining within the subject and spirit of the invention as defined by the following claims.

What is claimed is:

1. An apparatus for removing metal oxide from a substrate, the apparatus comprising:
    a plurality of devices for removing said metal oxide from said substrate when said substrate is being inserted into a plating system, said plurality of devices being external to said plating system, said plurality of devices forming at least a first linear aggregate discharge orifice set for providing a plasma curtain that contacts a slice of said substrate on a same side of said substrate when said substrate is inserted into said plating system, said substrate being configured to be inserted into said plating system in a first direction, said first linear aggregate discharge orifice set being perpendicular to said first direction when said substrate is inserted into said plating system, said first linear aggregate discharge orifice set being parallel to said slice of said substrate when said substrate is inserted into said plating system, said plurality of devices including at least a first device and a second device, wherein each device of said plurality of devices includes at least
        a powered electrode,
        a first dielectric layer,
        a first wire mesh disposed between said powered electrode and said first dielectric layer,
        a second dielectric layer disposed between said first dielectric layer and said powered electrode, wherein said first wire mesh is sandwiched between said first dielectric layer and said second dielectric layer, and
        a grounded electrode, said grounded electrode including an orifice at one end of said grounded electrode, said orifice configured for providing plasma to remove at least a portion of said metal oxide, said first dielectric layer disposed between said first wire mesh and said grounded electrode.

2. The apparatus of claim 1 wherein each device in said plurality of devices further includes at least
    a third dielectric layer disposed between said grounded electrode and said plasma when said plasma is present, and
    a second wire mesh disposed between said grounded electrode and said third dielectric layer.

3. The apparatus of claim 2 wherein each device in said plurality of devices further includes at least a fourth dielectric layer disposed between said third dielectric layer and said grounded electrode, said second wire mesh being sandwiched between said third dielectric layer and said fourth dielectric layer, said second wire mesh being not grounded.

4. The apparatus of claim 1, wherein said first wire mesh surrounds said powered electrode, and said first dielectric layer surrounds said first wire mesh.

5. The apparatus of claim 1, wherein said powered electrode is a longitudinal probe configured in said grounded electrode.

6. The apparatus of claim 1 further comprising a power source, wherein a diameter of each hole of said first wire mesh is less than a wavelength of a signal provided by said power source.

7. The apparatus of claim 1, wherein said first wire mesh is not grounded.

8. The apparatus of claim 1, wherein said first wire mesh is configured for operating the apparatus with a first recipe and is configured to be replaced with a second wire mesh for operating the apparatus with a second recipe.

9. The apparatus of claim 1, wherein each device of said plurality of devices further includes at least a gas inlet, said gas inlet is configured to receive an inert gas at a flow rate of less than 1 slm.

10. The apparatus of claim 1, wherein devices in said plurality of devices further forming at least a second linear aggregate discharge orifice set for providing a second plasma curtain, said second linear aggregate discharge orifice set including a plurality of discharge orifices, said second linear aggregate discharge orifice set being perpendicular to said first direction when said substrate is inserted into said plating system.

11. The apparatus of claim 10, wherein said first linear aggregate discharge orifice set includes a first plurality of discharge orifices, and said second linear aggregate discharge orifice set includes a second plurality of discharge orifices.

12. The apparatus of claim 1, wherein devices in said plurality of devices are consecutively arranged.

13. The apparatus of claim 1, wherein said first linear aggregate discharge orifice set includes a first plurality of discharge orifices, said discharge orifices being disposed on a plane that is parallel with said same side of said substrate.

14. The apparatus of claim 1, wherein aggregate orifice widths of orifices of grounded electrode of said set of devices are at least as wide as a diameter of said substrate.

15. The apparatus of claim 1, wherein a plasma effluent provided by said first device is isolated from a plasma effluent from said second device.

16. The apparatus of claim 1, wherein a plasma effluent provided by said first device and a plasma effluent from said second device simultaneously contact said slice of said substrate.

17. The apparatus of claim 1 wherein each device in said plurality of devices further includes at least
 a third dielectric layer disposed between said grounded electrode and said plasma when said plasma is present, and
 a second wire mesh disposed between said grounded electrode and said third dielectric layer, said first wire mesh having a first hole diameter, said second wire mesh having a second hole diameter that is different from the first hole diameter.

18. The apparatus of claim 1 further comprising a sealed box coupled with at least a device of the plurality for pressurizing gas.

19. The apparatus of claim 1 further comprising a power source, wherein a surface variation of said First wire mesh is less than a wavelength of a signal provided by said power source.

20. A processing system for processing at least a substrate, the processing system comprising:
 a plating system; and
 a plurality of devices for removing metal oxide from said substrate when said substrate is being inserted into said plating system, said plurality of devices being disposed outside said plating system, said plurality of devices forming at least a first linear aggregate discharge orifice set for providing a plasma curtain that contacts a slice of said substrate on a same side of said substrate when said substrate is inserted into said plating system, said substrate being configured to be inserted into said plating system in a first direction, said first linear aggregate discharge orifice set being perpendicular to said first direction when said substrate is inserted into said plating system, said first linear aggregate discharge orifice set being parallel to said slice of said substrate when said substrate is inserted into said plating system, said plurality of devices including at least a first device and a second device, wherein each device of said plurality of devices includes at least
 a powered electrode,
 a first dielectric layer,
 a first wire mesh disposed between said powered electrode and said first dielectric layer,
 a second dielectric layer disposed between said first dielectric layer and said powered electrode, wherein said first wire mesh is sandwiched between said first dielectric layer and said second dielectric layer, and
 a first wire mesh disposed between said powered electrode and said first dielectric layer, and
 a grounded electrode, said grounded electrode including an orifice at one end of said grounded electrode, said orifice configured for providing plasma to remove at least a portion of said metal oxide, said first dielectric layer disposed between said first wire mesh and said grounded electrode.

* * * * *